United States Patent
Healy et al.

(10) Patent No.: US 9,898,218 B2
(45) Date of Patent: Feb. 20, 2018

(54) MEMORY SYSTEM WITH SWITCHABLE OPERATING BANDS

(71) Applicant: International Business Machines Corporation, Armonk, NY (US)

(72) Inventors: Michael B. Healy, Cortlandt Manor, NY (US); Hillery C. Hunter, Chappaqua, NY (US); Kyu-hyoun Kim, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/016,353

(22) Filed: Feb. 5, 2016

(65) Prior Publication Data

US 2017/0228186 A1    Aug. 10, 2017

(51) Int. Cl.
*G06F 12/00* (2006.01)
*G06F 3/06* (2006.01)
*G11C 7/22* (2006.01)

(52) U.S. Cl.
CPC .......... *G06F 3/0625* (2013.01); *G06F 3/0632* (2013.01); *G06F 3/0658* (2013.01); *G06F 3/0659* (2013.01); *G06F 3/0673* (2013.01); *G11C 7/22* (2013.01)

(58) Field of Classification Search
None
See application file for complete search history.

(56) References Cited

U.S. PATENT DOCUMENTS

| | | | |
|---|---|---|---|
| 8,294,445 B2 | 10/2012 | Kwok | |
| 8,674,772 B2 | 3/2014 | Shen | |
| 8,743,627 B2 | 6/2014 | Chen et al. | |
| 2011/0022789 A1* | 1/2011 | Fujimoto | G06F 1/266 711/103 |
| 2012/0159230 A1 | 6/2012 | Chen | |
| 2012/0173836 A1 | 7/2012 | Yermalayeu | |

(Continued)

FOREIGN PATENT DOCUMENTS

CN    104464803    3/2015

OTHER PUBLICATIONS

Disclosed anonymously (Nov. 2011) Adaptive Bus Memory Compression IPCOM000212346D, 3 pages.

(Continued)

*Primary Examiner* — Daniel Tsui
(74) *Attorney, Agent, or Firm* — Cantor Colburn LLP; Mercedes Hobson

(57) ABSTRACT

An aspect includes determining a configuration change to at least one memory device of a memory system. A band switch enable command is sent from a memory controller to the at least one memory device indicating the configuration change. One or more internal circuits of the at least one memory device are set into a quiescent mode based on receiving the band enable command. One or more of a voltage and a frequency of the at least one memory device are adjusted to implement the configuration change. A band switch disable command is sent from the memory controller to the at least one memory device based on completing the adjusting. The one or more internal circuits are enabled to operate using the adjustment based on receiving the band switch disable command from the memory controller.

19 Claims, 5 Drawing Sheets

(56) References Cited

U.S. PATENT DOCUMENTS

| | | | |
|---|---|---|---|
| 2013/0262792 A1* | 10/2013 | Barth, Jr. | G06F 1/3275 |
| | | | 711/154 |
| 2015/0016191 A1 | 1/2015 | Tsai et al. | |
| 2016/0342198 A1* | 11/2016 | Hsu | G06F 1/3206 |

OTHER PUBLICATIONS

H. David, et al., Memory Power Management via Dynamic Voltage/Frequency Scaling, Jun. 2011, In Proceedings of the 8th ACM International Conference of Autonomic Computing, pp. 31-40.

List of IBM Patents and Patent Applications Treated as Related, Dec. 5, 2017, 2 pages.

U.S. Appl. No. 15/826,751, filed Nov. 30, 2017, Entitled: Memory System With Switchable Operating Bands, First Named Inventor: Michael B. Healy.

* cited by examiner

MEMORY SYSTEM WITH SWITCHABLE OPERATING BANDS

BACKGROUND

The present invention relates to computer memory systems, and more specifically, to a computer memory system with switchable operating bands.

In some computer system applications, it is desirable to adjust power and peak bandwidth depending on the current work load. For processor core power adjustments, dynamic voltage and frequency scaling (DVFS) has been widely used. Memory devices in memory systems typically operate at a constant voltage and frequency. Memory devices are complex and include a mixture of analog and digital circuits with synchronous and asynchronous circuits. Therefore, it is not typically possible to dynamically adjust voltage and frequency during computer system operation, as internal circuits are optimized to certain conditions and may only be adaptable during power up.

SUMMARY

According to one embodiment, a method of operating band switching in a memory system of a computer system is provided. The method includes determining a configuration change to at least one memory device of the memory system. The configuration change includes at least one adjustment to one or more of a voltage and a frequency of the at least one memory device. A band switch enable command is sent from a memory controller of the memory system to the at least one memory device. The band switch enable command indicates the configuration change. One or more internal circuits of the at least one memory device are set into a quiescent mode based on receiving the band enable command. One or more of the voltage and the frequency of the at least one memory device are adjusted to implement the configuration change. A band switch disable command is sent from the memory controller to the at least one memory device based on completing the adjusting of one or more of the voltage and the frequency. The one or more internal circuits of the at least one memory device are enabled to operate using the at least one adjustment to one or more of the voltage and the frequency based on receiving the band switch disable command from the memory controller.

According to another embodiment, a memory system includes at least one memory device coupled through an interface to a memory controller. The memory system is configured to determine a configuration change to the at least one memory device. The configuration change includes an adjustment to a voltage of the at least one memory device. The voltage of the at least one memory device is adjusted to implement the configuration change.

According to yet another embodiment, a computer program product for operating band switching in a memory system of a computer system is provided. The computer program product includes a computer readable storage medium having program instructions embodied therewith. The program instructions are executable by processing circuitry to cause the processing circuitry to determine a configuration change to at least one memory device of the memory system. The configuration change includes at least one adjustment to one or more of a voltage and a frequency of the at least one memory device. A band switch enable command is sent from a memory controller of the memory system to the at least one memory device. The band switch enable command indicates the configuration change. One or more of the voltage and the frequency of the at least one memory device are adjusted to implement the configuration change. A band switch disable command is sent from the memory controller to the at least one memory device based on completing the adjusting of one or more of the voltage and the frequency.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein are directed to a computer memory system with switchable operating bands to dynamically adjust memory device voltage and/or frequency. Embodiments provide a multi-step process to switch operating bands of a memory device during operation of a computer system. A band switch enable command can be sent from a memory controller to at least one memory device requesting a change in one or more of a memory voltage and a memory frequency. The at least one memory device can interpret the band switch enable command or at least one parameter of the band switch enable command to determine a new operating voltage and/or frequency for the at least one memory device. Each memory device may use a lookup table to determine corresponding control settings for various internal circuits of the memory device. The band switch enable command may also serve as a notice of a planned change to the operating environment of each memory device before a change to the voltage and/or frequency is made.

A memory device can place one or more internal circuits in a quiescent mode based on receiving the band switch enable command to wait for environmental conditions to stabilize. Upon environmental condition change completion, the memory controller can send a band switch disable command to inform the memory device that environment condition changes have stabilized. The memory controller may wait a predetermined period of time after sending the band switch disable command until sending one or more additional commands (e.g., read or write command) to allow the memory device an adjustment period at the updated environmental conditions (e.g., a new voltage and/or frequency).

Figure 1:
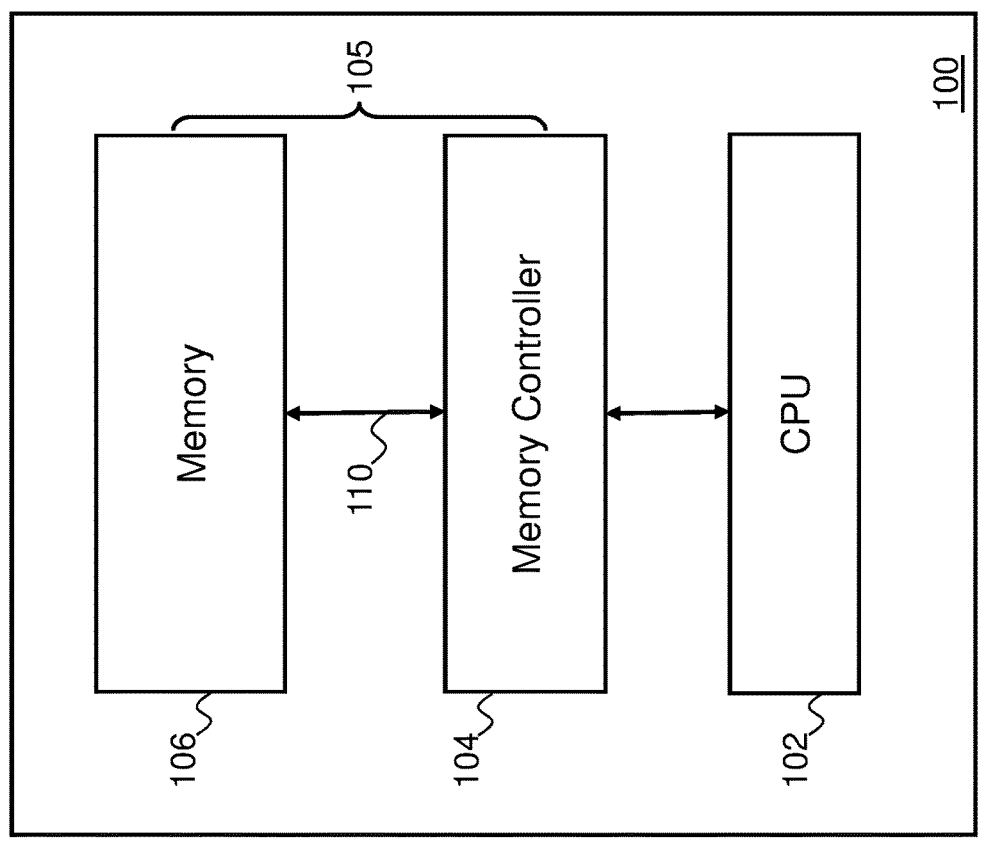
FIG. 1 is a block diagram of an exemplary system according to embodiments of the invention.

FIG. 1 illustrates a block diagram of a system 100, which is a computer system that supports memory system operating band switching in accordance with an embodiment. The system 100 depicted in FIG. 1 includes a computer processor 102, memory 106 including multiple memory devices, and a memory controller 104 for reading and storing data in the memory 106 via an interface 110. Collectively, the memory controller 104 and the memory 106 are referred to as a memory system 105. The computer processor 102 and the interface 110 may operate at different voltage levels and frequencies with respect to each other. The computer processor 102 can be a single core or multi-core processor, where each core may have different voltage and/or frequency settings.

In one embodiment the memory controller 104 is coupled to the computer processor 102 and receives read or write requests from the computer processor 102. The memory controller 104 can control signal timing, such as signal frequencies and delays, on the interface 110. The memory controller 104 may also control one or more voltages supplied to the memory 106.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
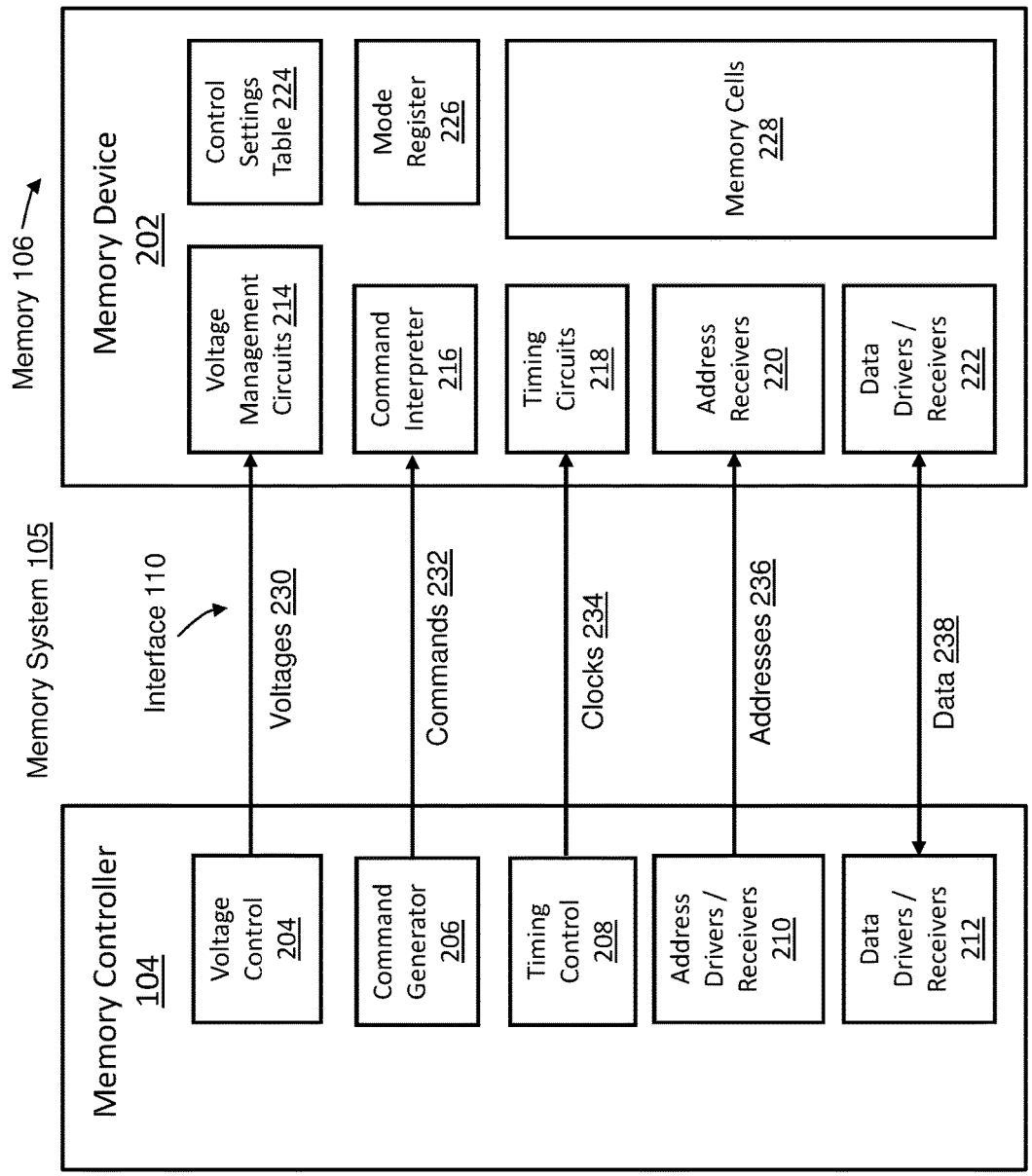
FIG. 2 is a block diagram of a memory system according to an embodiment of the invention.

FIG. 2 is a block diagram of a portion of the memory system 105 of FIG. 1 according to an embodiment. The memory system 105 includes memory controller 104 coupled to memory 106 via interface 110. In the example of FIG. 2, memory 106 is depicted as a single memory device 202. It will be understood that the memory controller 104 can interface with multiple memory devices 202, which may be organized in memory ranks, memory banks, memory modules, or the like. The interface 110 includes a plurality of links that may be unidirectional or bidirectional to propagate power, control, address, and data signals between the memory controller 104 and the memory device 202.

In the example of FIG. 2, the memory controller 104 includes a voltage control 204, a command generator 206, a timing control 208, address drivers/receivers 210, and data drivers/receivers 212. It will be understood that the memory controller 104 includes other interfaces and logic (e.g., processing circuitry) that are not depicted in FIG. 2, for instance, to support communication with computer processor 102 of FIG. 1, as well as various state machines, built-in test features, and the like. Memory device 202 includes voltage management circuits 214, a command interpreter 216, timing circuits 218, address receivers 220, data drivers/receivers 222, a control settings table 224, a mode register 226, and memory cells 228.

The voltage control 204 can provide one or more voltages 230 to voltage management circuits 214 via interface 110. Although the voltage control 204 of memory controller 104 is depicted as directly driving voltages 230 to voltage management circuits 214 in memory device 202, there may be additional voltage signal conditioning and regulation circuitry (not depicted) interposed between the voltage control 204 and voltage management circuits 214.

The command generator 206 can send commands 232 to command interpreter 216 via interface 110. Commands 232 may include memory read, memory write, and memory device configuration commands. For example, the command generator 206 can send mode register set commands to the command interpreter 216 to modify one or more state of the mode register 226. Changes to the mode register 226 can be propagated to the control settings table 224 to drive one or more changes to internal circuits of the memory device 202. For instance, when operating at different voltages and/or frequencies, timing and scaling parameters may need to be adjusted within the memory device 202. As one example, Table 1 illustrates how bits Ax and Ay of mode register 226 can be interpreted by control settings table 224 to decode multiple predefined operating bands A-D to support various voltage (V1-V4) and frequency (F1-F4) combinations.

TABLE 1

Example register bit definition for band switching

| | Ax | Ay | Voltage | Frequency |
|---|---|---|---|---|
| Band A | 0 | 0 | V1 | F1 |
| Band B | 0 | 1 | V2 | F2 |
| Band C | 1 | 0 | V3 | F3 |
| Band D | 1 | 1 | V4 | F4 |

Timing control 208 sends clocks 234 to timing circuits 218 via interface 110. The timing circuits 218 can generate various delays and synchronization signals within the memory device 202 and may also be used to control signal sampling by the address receivers 220 and data drivers/receivers 222 among other interfaces. For example, timing established by clocks 234 may control sampling of addresses 236 and data 238 on interface 110 as driven from address drivers/receivers 210 and data drivers/receivers 212 respectively to read and write data from/to memory cells 228.

Figure 3:
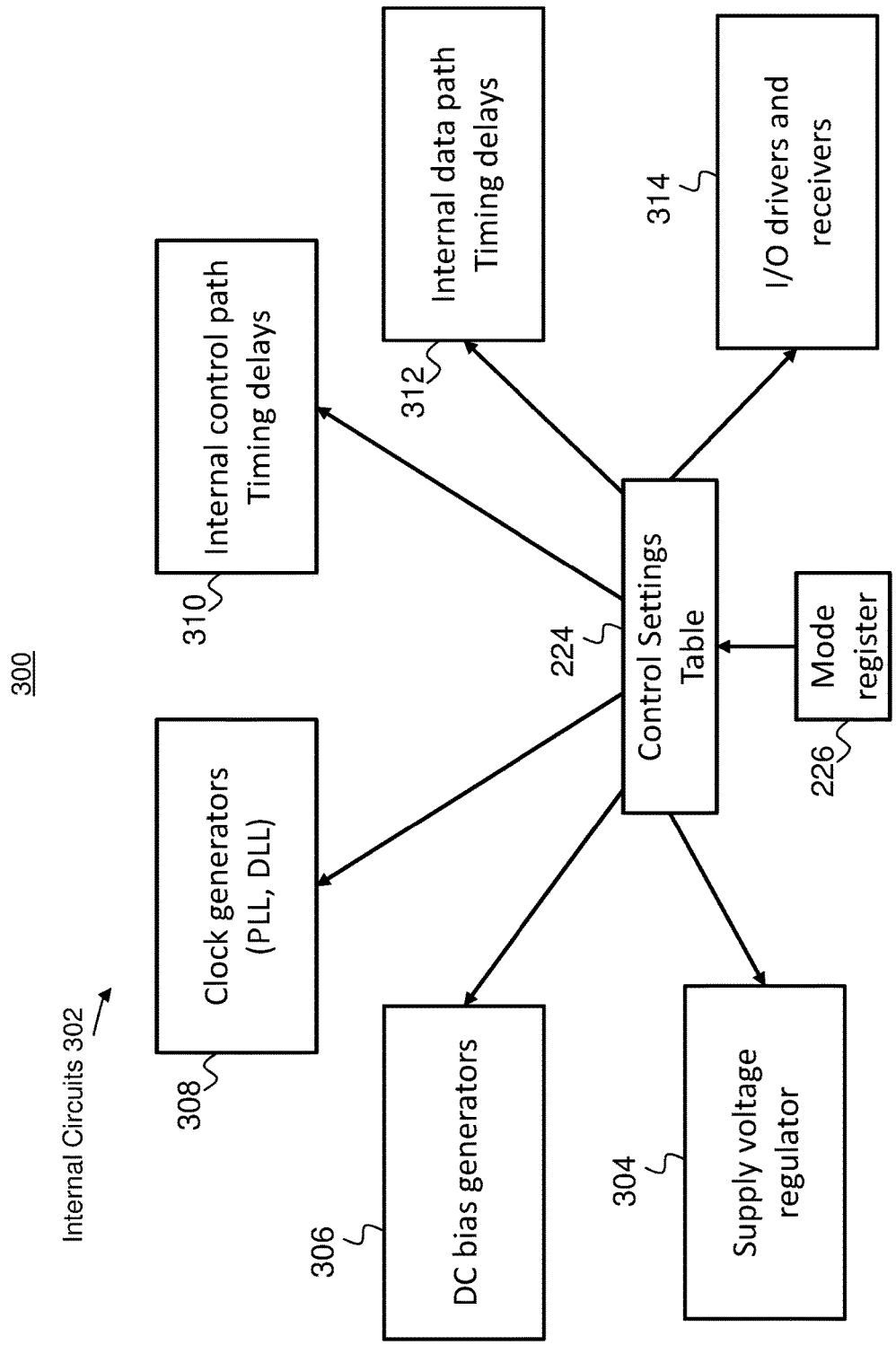
FIG. 3 is a block diagram of a control setting system in a memory device according to an embodiment of the invention.

FIG. 3 is a block diagram of a control setting system 300 in memory device 202 of FIG. 2 according to an embodiment. The example of FIG. 3 is depicted with respect to internal circuits 302 of the memory device 202. For instance, a band enable command can include control settings for mode register 226 that are passed to control settings table 224 that maps a plurality of configuration codes for two or more voltage and frequency combinations. A band enable command may be received from the memory controller 104 of FIG. 2 as one of the commands 232 of FIG. 2. A band enable command may trigger one or more preparation actions for the internal circuits 302 in anticipation of a voltage and/or frequency change. For instance, the internal circuits 302 can be set into a quiescent mode based on receiving the band enable command such that fluctuations in voltage and/or frequency do not result in data loss or corruption of memory cells 228.

In the example of FIG. 3, the internal circuits 302 include supply voltage regulator 304, DC bias generator 306, clock generators 308, internal control path timing delays 310, internal data path timing delays 312, and input/output (I/O) drivers and receivers 314. The supply voltage regulator 304 and DC bias generator 306 are examples of circuits that may be incorporated in the voltage management circuits 214 of FIG. 2. The clock generators 308, internal control path timing delays 310, and internal data path timing delays 312 are examples of circuits that may be incorporated in the timing circuits 218 of FIG. 2. The I/O drivers and receivers 314 may support interfacing the address receivers 220 and data drivers/receivers 222 with memory cells 228 of FIG. 2. The clock generators 308 may establish at least one timing lock (e.g., a phase-locked loop or delay-locked loop) relative to an external clock (e.g., clocks 234 of FIG. 2). One or more of the clock generators 308 may be disabled in the quiescent mode and re-enabled based on receiving a band switch disable command or other condition. For instance, a clock enable signal may be used to freeze or otherwise disable one or more outputs of the clock generators 308. While the quiescent mode is active, the DC bias generators 306 and/or supply voltage regulators 304 may operate in a reduced capability mode to ensure that data corruption of the memory cells 228 is avoided.

Figure 4:
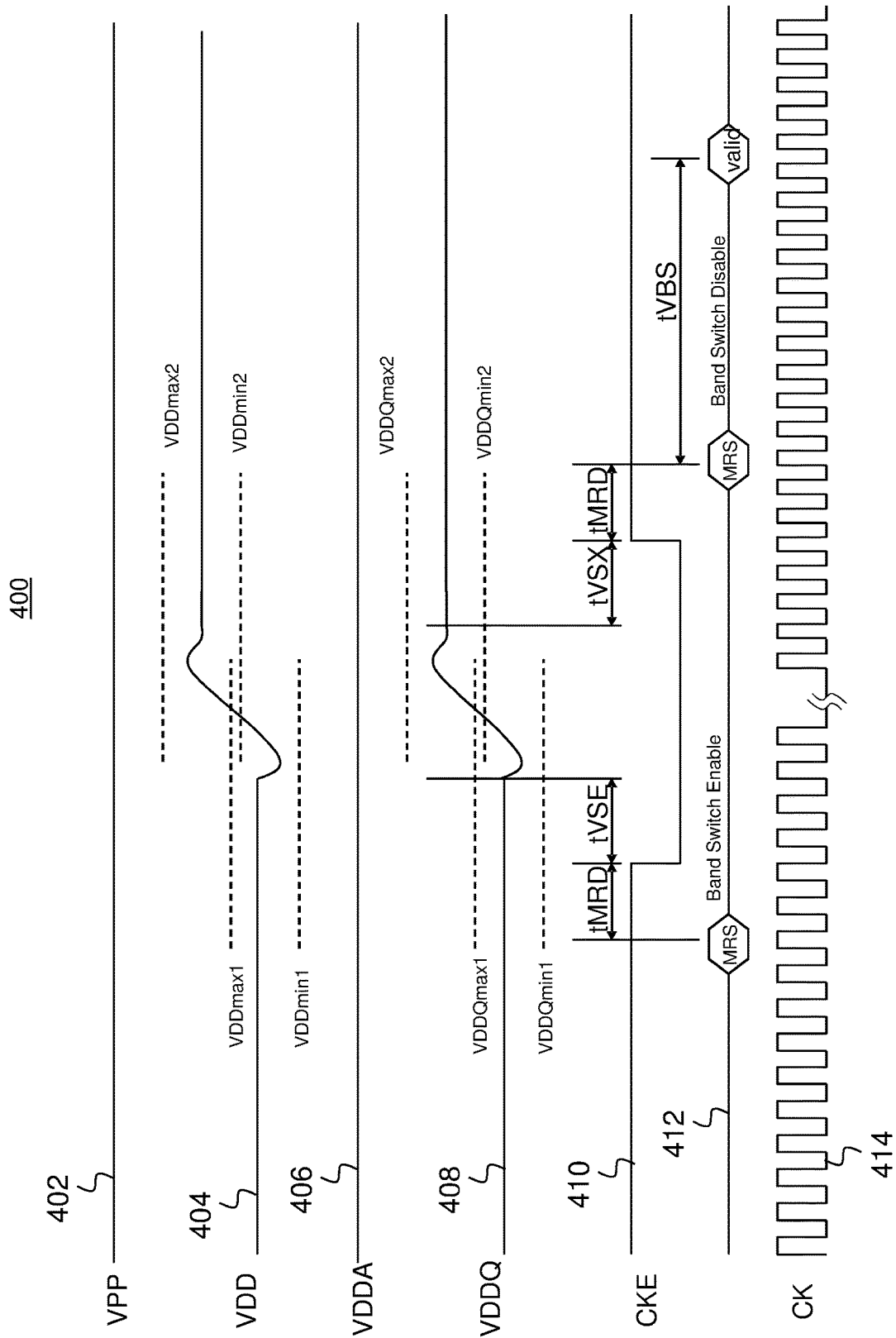
FIG. 4 is an example of a timing diagram according to an embodiment of the invention.

FIG. 4 is a timing diagram 400 according to an embodiment. The example of FIG. 4 illustrates how some voltage lines, such as programming mode voltage VPP 402 and voltage VDDA 406, may remain unchanged during a voltage change while other voltage lines, such as voltage VDD 404 and voltage VDDQ 408 can transition between different voltage levels during an operating band change. In the example of FIG. 4, voltage VDD 404 transitions from within a first voltage band defined between VDDmin1 and VDDmax1 to a second voltage band defined between VDDmin2 and VDDmax2. Similarly, voltage VDDQ 408 transitions from within a first voltage band defined between VDDQmin1 and VDDQmax1 to a second voltage band defined between VDDQmin2 and VDDQmax2. To control the transition timing and provide adequate notice to memory device 202, memory controller 104 may use a clock enable signal (CKE) 410 in combination with commands 232 sent on a command bus 412. In the example of FIG. 4, the frequency of clock (CK) 414 also changes; however, in some embodiments only one or more voltage provided to the memory device 202 changes between operating bands.

In the timing sequence of FIG. 4, a mode register set command is sent on command bus 412 including a band switch enable command indicating a configuration change (e.g., a change in voltages VDD 404 and VDDQ 408 in combination with a frequency change for clock 414). A minimum command delay period (tMRD) can be defined to allow the band switch enable command to be recognized by the memory device 202 and set up internal modes to protect against problems during voltage/clock instability (e.g., setting one or more internal circuits 302 of FIG. 3 into a quiescent mode). The memory controller 104 can change a state of the clock enable signal CKE 410 from enabled to disabled after waiting for tMRD. Changes to clock 414 and voltages occur after a clock enable signal CKE 410 is set to disabled and waiting for a voltage switching enable time (tVSE). After adjusting one or more of the voltage and the frequency and waiting for a voltage switching exit time (tVSX), the state of the clock enable signal CKE 410 changes from disabled to enabled. During another tMRD after changing the state of the clock enable signal CKE 410 from disabled to enabled, the memory device 202 can track to any changes in clock 414 which has now stabilized.

The memory controller 104 can send a mode register set command including a band switch disable command to inform the memory device 202 that voltage and frequency changes have been completed. The memory controller 104 can wait for a voltage band switch settling period (tVBS) subsequent to sending the band switch disable command before sending a subsequent (valid) command from the memory controller 104 to the memory device 202 to ensure all internal timing and voltage changes have settled within the memory device 202.

Figure 5:
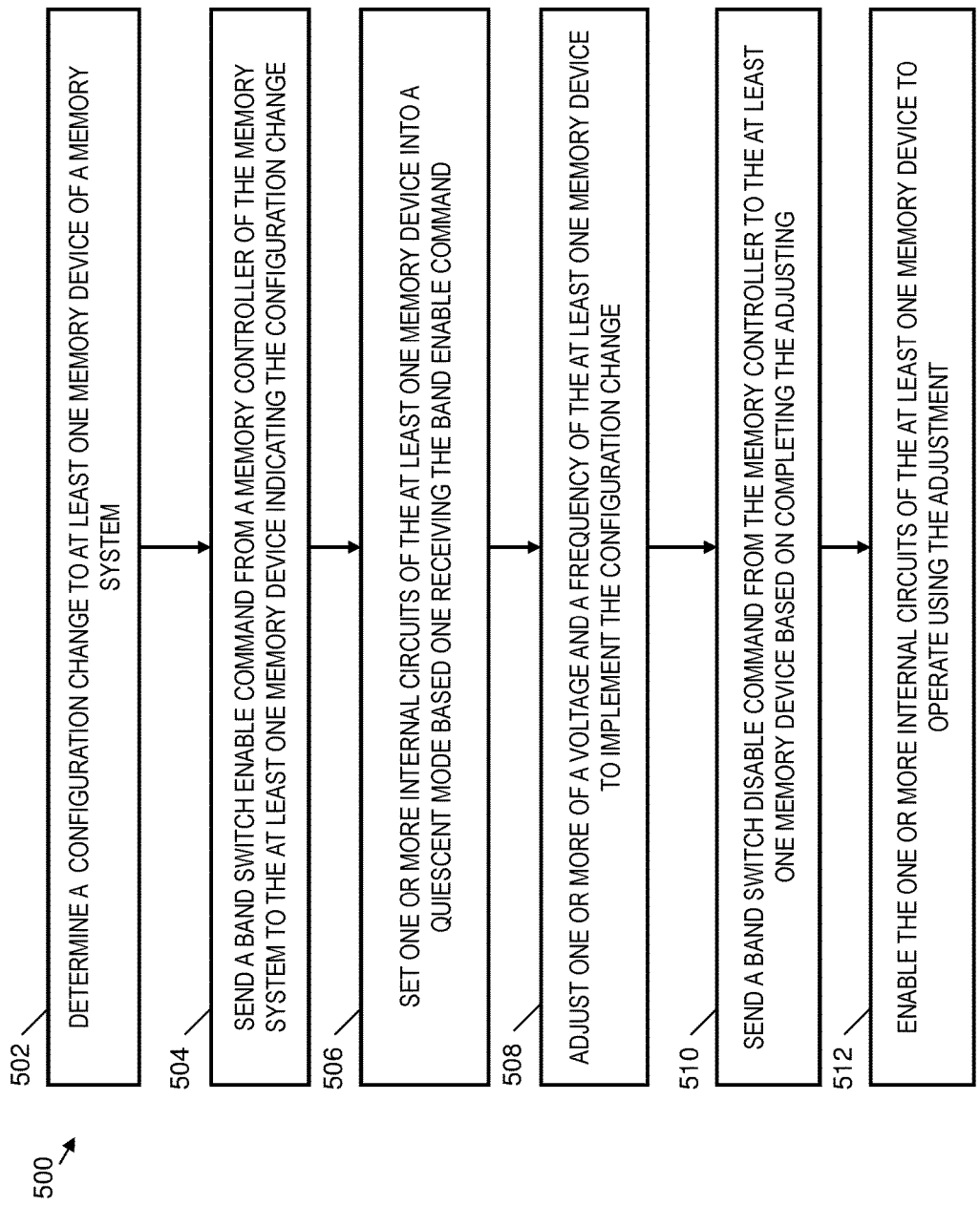
FIG. 5 is a process flow according to an embodiment of the invention.

FIG. 5 is a process flow of a method 500 according to an embodiment. The method 500 can be performed by various elements of the system 100 of FIG. 1, such as the memory system 105 of FIG. 1, and is described in reference to FIGS. 1-5. Although a particular order of blocks is depicted and described with respect to FIG. 5, it will be understood that the order can be changed, and the blocks may be combined or further subdivided. For purposes of explanation, the method 500 is described with respect to the memory controller 104 and at least one instance of memory device 202.

At block 502, the memory controller 104 determines a configuration change to at least one memory device 202 of the memory system 105. The configuration change can include at least one adjustment to one or more of a voltage and a frequency of the at least one memory device 202. The determination may be made based on a request from a power optimization control, instructions executed by the computer processor 102, and/or other sources.

At block 504, memory controller 104 sends a band switch enable command to the at least one memory device 202, where the band switch enable command indicates the configuration change. The band switch enable command can be sent in a mode register set command. The at least one memory device 202 can include a control settings table 224 that maps a plurality of configuration codes settable using the band switch enable command between two or more voltage and frequency combinations.

At block 506, one or more internal circuits 302 of the at least one memory device 202 are set into a quiescent mode based on receiving the band enable command. Setting one or more internal circuits 302 of the at least one memory device 202 into the quiescent mode can include disabling one or more clock generators 308 of the at least one memory device 202.

At block 508, the memory controller 104 adjusts one or more of the voltage and the frequency of the at least one memory device 202 to implement the configuration change. Before adjusting the voltage and/or frequency, the memory controller 104 can change a state of a clock enable signal CKE 410 from enabled to disabled after waiting for a minimum command delay period (tMRD) subsequent to sending the band switch disable command. The memory controller 104 can wait for a voltage switching enable time (tVSE) after changing the state of the clock enable signal CKE 410 before adjusting one or more of the voltage and the frequency of the at least one memory device 202 to implement the configuration change. The memory controller 104 can wait for a voltage switching exit time (tVSX) after adjusting one or more of the voltage and the frequency of the at least one memory device 202 to implement the configuration change. The memory controller 104 can change the state of the clock enable signal CKE 410 from disabled to enabled after waiting for the voltage switching exit time (tVSX).

At block 510, the memory controller 104 sends a band switch disable command to the at least one memory device 202 based on completing the adjusting of one or more of the voltage and the frequency. The band switch disable command can be sent in a mode register set command that is separate from the mode register set command used to send the band switch enable command. The memory controller 104 can wait for the minimum command delay period (tMRD) after changing the state of the clock enable signal CKE 410 from disabled to enabled before sending the band switch disable command. The memory controller 104 can also wait for a voltage band switch settling period (tVBS) subsequent to sending the band switch disable command before sending a subsequent command from the memory controller 104 to the at least one memory device 202. Enabling the one or more internal circuits 302 of the at least one memory device 202 can include internally resetting at least one of the one or more internal circuits 302 after the adjustment to one or more of the voltage and the frequency is completed. Enabling the one or more internal circuits 302 of the at least one memory device 202 can also or alternatively include establishing at least one timing lock relative to an external clock using the one or more clock generators 308.

At block 512, one or more internal circuits 302 of the at least one memory device 202 are enabled to operate using the at least one adjustment to one or more of the voltage and the frequency based on receiving the band switch disable command from the memory controller 104.

Technical effects and benefits include adjusting the voltage and/or frequency of memory devices in a memory system. A multi-step command sequence allows memory devices to prepare for voltage and/or frequency changes before the changes occur and to adapt to the changes after they occur while avoiding adverse effects during the transition period.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of operating band switching in a memory system of a computer system, the method comprising:
   determining a configuration change to at least one memory device of the memory system, the configuration change comprising at least one adjustment to one or more of a voltage and a frequency of the at least one memory device;
   sending a band switch enable command from a memory controller of the memory system to the at least one memory device, the band switch enable command indicating the configuration change;
   changing a state of a clock enable signal from enabled to disabled after waiting for a minimum command delay period subsequent to sending the band switch enable command;
   setting one or more internal circuits of the at least one memory device into a quiescent mode based on receiving the band switch enable command;
   waiting for a voltage switching enable time after changing the state of the clock enable signal before adjusting one or more of the voltage and the frequency of the at least one memory device to implement the configuration change;
   adjusting one or more of the voltage and the frequency of the at least one memory device to implement the configuration change;
   sending a band switch disable command from the memory controller to the at least one memory device based on completing the adjusting of one or more of the voltage and the frequency; and
   enabling the one or more internal circuits of the at least one memory device to operate using the adjustment to one or more of the voltage and the frequency based on receiving the band switch disable command from the memory controller.

2. The method according to claim 1, wherein the band switch enable command and the band switch disable command are sent in separate mode register set commands.

3. The method according to claim 1, further comprising:
   waiting for a voltage switching exit time after adjusting one or more of the voltage and the frequency of the at least one memory device to implement the configuration change; and
   changing the state of the clock enable signal from disabled to enabled after waiting for the voltage switching exit time.

4. The method according to claim 3, further comprising:
   waiting for the minimum command delay period after changing the state of the clock enable signal from disabled to enabled before sending the band switch disable command; and
   waiting for a voltage band switch settling period subsequent to sending the band switch disable command before sending a subsequent command from the memory controller to the at least one memory device.

5. The method according to claim 1, wherein the at least one memory device comprises a control settings table that maps a plurality of configuration codes settable using the band switch enable command between two or more voltage and frequency combinations.

6. The method according to claim 1, wherein enabling the one or more internal circuits of the at least one memory device comprises internally resetting at least one of the one or more internal circuits after the adjustment to one or more of the voltage and the frequency is completed.

7. The method according to claim 1, wherein setting one or more internal circuits of the at least one memory device into the quiescent mode comprises disabling one or more clock generators of the at least one memory device, and enabling the one or more internal circuits of the at least one memory device comprises establishing at least one timing lock relative to an external clock using the one or more clock generators.

8. A memory system comprising:
at least one memory device coupled through an interface to a memory controller, the memory system configured to perform:
determining a configuration change to the at least one memory device, the configuration change comprising an adjustment to one or more of a voltage and a frequency of the at least one memory device;
sending a band switch enable command from the memory controller to the at least one memory device, the band switch enable command indicating the configuration change;
changing a state of a clock enable signal from enabled to disabled after waiting for a minimum command delay period subsequent to sending the band switch enable command;
setting one or more internal circuits of the at least one memory device into a quiescent mode based on receiving the band switch enable command;
waiting for a voltage switching enable time after changing the state of the clock enable signal before adjusting one or more of the voltage and the frequency of the at least one memory device to implement the configuration change;
adjusting one or more of the voltage and the frequency of the at least one memory device to implement the configuration change;
sending a band switch disable command from the memory controller to the at least one memory device based on completing the adjusting of one or more of the voltage and the frequency; and
enabling the one or more internal circuits of the at least one memory device to operate using the adjustment to one or more of the voltage and the frequency based on receiving the band switch disable command from the memory controller.

9. The memory system according to claim 8, further configured to perform:
waiting for a voltage switching exit time after adjusting one or more of the voltage and the frequency of the at least one memory device to implement the configuration change; and
changing the state of the clock enable signal from disabled to enabled after waiting for the voltage switching exit time.

10. The memory system according to claim 9, further configured to perform:
waiting for the minimum command delay period after changing the state of the clock enable signal from disabled to enabled before sending the band switch disable command; and
waiting for a voltage band switch settling period subsequent to sending the band switch disable command before sending a subsequent command from the memory controller to the at least one memory device.

11. The memory system according to claim 8, wherein the at least one memory device comprises a control settings table that maps a plurality of configuration codes settable using the band switch enable command between two or more voltage and frequency combinations.

12. The memory system according to claim 8, wherein the band switch enable command and the band switch disable command are sent in separate mode register set commands.

13. The memory system according to claim 8, wherein setting one or more internal circuits of the at least one memory device into the quiescent mode comprises disabling one or more clock generators of the at least one memory device, and enabling the one or more internal circuits of the at least one memory device comprises establishing at least one timing lock relative to an external clock using the one or more clock generators.

14. A computer program product for operating band switching in a memory system of a computer system, the computer program product comprising a computer readable storage medium having program instructions embodied therewith, the program instructions executable by processing circuitry to cause the processing circuitry to:
determine a configuration change to at least one memory device of the memory system, the configuration change comprising at least one adjustment to one or more of a voltage and a frequency of the at least one memory device;
send a band switch enable command from a memory controller of the memory system to the at least one memory device, the band switch enable command indicating the configuration change;
change a state of a clock enable signal from enabled to disabled after waiting for a minimum command delay period subsequent to sending the band switch enable command;
wait for a voltage switching enable time after changing the state of the clock enable signal before adjusting one or more of the voltage and the frequency of the at least one memory device to implement the configuration change;
adjust one or more of the voltage and the frequency of the at least one memory device to implement the configuration change; and
send a band switch disable command from the memory controller to the at least one memory device based on completing the adjusting of one or more of the voltage and the frequency.

15. The computer program product according to claim 14, wherein the band switch enable command and the band switch disable command are sent in separate mode register set commands.

16. The computer program product according to claim 14, wherein the program instructions cause the processing circuitry to:
wait for a voltage switching exit time after adjusting one or more of the voltage and the frequency of the at least one memory device to implement the configuration change; and
change the state of the clock enable signal from disabled to enabled after waiting for the voltage switching exit time.

17. The computer program product according to claim 16, wherein the program instructions cause the processing circuitry to:
wait for the minimum command delay period after changing the state of the clock enable signal from disabled to enabled before sending the band switch disable command; and
wait for a voltage band switch settling period subsequent to sending the band switch disable command before sending a subsequent command from the memory controller to the at least one memory device.

18. The computer program product according to claim 14, wherein the band switch enable command triggers the at least one memory device to set one or more internal circuits of the at least one memory device into a quiescent mode, and the band switch disable command triggers the at least one memory device to enable the one or more internal circuits of the at least one memory device to operate using the adjustment to one or more of the voltage and the frequency.

19. The computer program product according to claim 18, wherein the quiescent mode disables one or more clock generators of the at least one memory device, and enabling the one or more internal circuits of the at least one memory device establishes at least one timing lock relative to an external clock using the one or more clock generators.

\* \* \* \* \*